United States Patent [19]

Fukuda et al.

[11] Patent Number: 5,182,495
[45] Date of Patent: Jan. 26, 1993

[54] PLASMA PROCESSING METHOD AND APPARATUS USING ELECTRON CYCLOTRON RESONANCE

[75] Inventors: Takuya Fukuda; Michio Ohue, both of Hitachi; Tadasi Sonobe, Iwaki, all of Japan

[73] Assignee: Hitachi, Ltd., Tokyo, Japan

[21] Appl. No.: 619,338

[22] Filed: Nov. 29, 1990

[30] Foreign Application Priority Data

Nov. 29, 1989 [JP] Japan .................................. 1-307718

[51] Int. Cl.$^5$ ............................................. H05H 1/18
[52] U.S. Cl. ........................... 315/111.41; 315/111.21; 313/231.31; 204/298.38
[58] Field of Search ..................... 315/111.21, 111.41, 315/111.81; 313/231.31; 250/423 R; 204/298.38, 298.13

[56] References Cited

U.S. PATENT DOCUMENTS

| | | | |
|---|---|---|---|
| 4,298,419 | 11/1981 | Suzuki et al. | 204/298.38 X |
| 4,776,918 | 10/1988 | Otsubo et al. | 204/298.38 X |
| 4,876,983 | 10/1989 | Fukuda et al. | 204/298.38 X |
| 5,013,401 | 5/1991 | Samukawa et al. | 204/298.38 X |
| 5,021,114 | 6/1991 | Saito et al. | 204/298.38 X |

FOREIGN PATENT DOCUMENTS 56-13480 2/1981 Japan.
197327 8/1988 Japan.

OTHER PUBLICATIONS

Fukuda et al., "Effects of Applied Magnetic Fields on Silicon Oxide Films Formed by Microwave Plasma CVD", Japanese Journal of Applied Physics, vol. 27, No. 10, Oct., 1988, pp. L1962-L1965.
Fukuda et al., "Effects of Excited Plasma Species on Silicon Oxide Films Formed by Microwave Plasma CVD", Japanese Journal of Applied Physics, vol. 28, No. 6, Jun. 1989, pp. 1035-1040.

Primary Examiner—Eugene R. LaRoche
Assistant Examiner—Do Hum Yoo
Attorney, Agent, or Firm—Antonelli, Terry Stout & Kraus

[57] ABSTRACT

In a plasma processing apparatus using ECR, faces in contact with plasma excepting a substance to be processed are covered by an insulating material. By such configuration, discharge caused between the plasma and the substance to be processed in plasma processing is prevented beforehand.

24 Claims, 10 Drawing Sheets

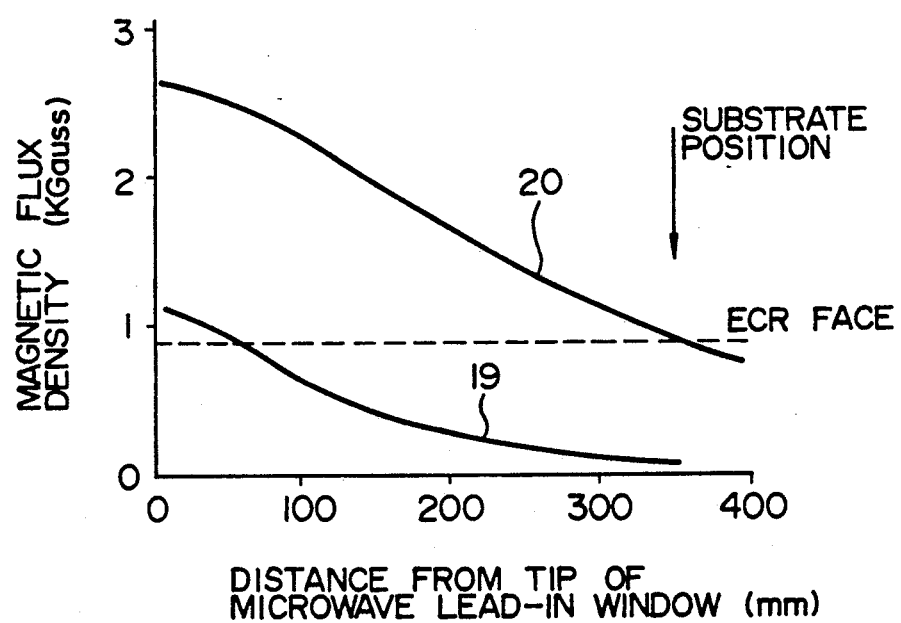
F I G. 2

F I G. 25
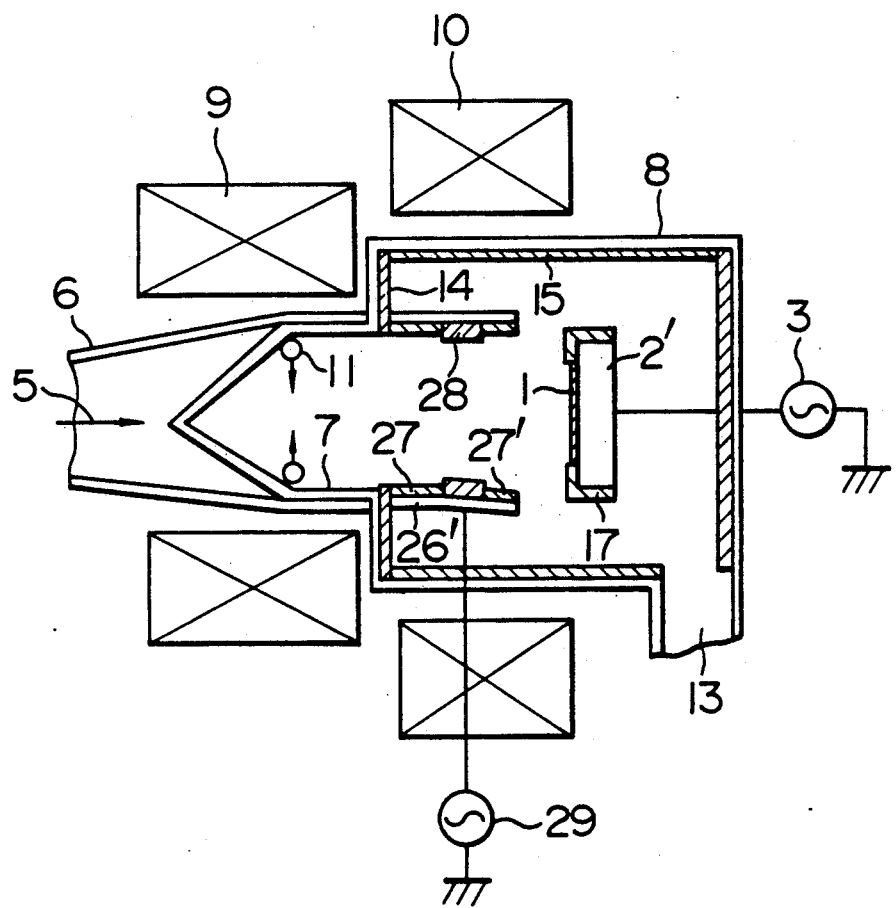

PLASMA PROCESSING METHOD AND APPARATUS USING ELECTRON CYCLOTRON RESONANCE

BACKGROUND OF THE INVENTION

1. Field of the Invention

The present invention relates to a processing method, and apparatus using plasma generated by electron cyclotron resonance (hereafter abbreviated to ECR), and in particular to a plasma processing method, and apparatus, suitable for film forming, strong anisotropy etching, surface refining or plasma doping comprising processing while impinging ions from plasma on a substrate.

2. Description of the Related Art

In conventional plasma processing apparatuses, especially those proposed to enhance the ion processing efficiency, as described in JP-A-56-13480 and JP-A-63-197327, means is provided for generating plasma and a high-frequency electric field having a frequency that ions can follow is applied to a substrate to be processed. Ions are impinged on the substrate by the high-frequency electric field, the substrate being thus processed.

The above described prior art attempts to improve the processing efficiency and uniformity of a plasma processing apparatus by applying a high-frequency electric field to the substrate to impinge ions on the substrate with a frequency which can be followed by the ions. However, control of an induced DC potential generated in the substrate on the basis of discharge caused between the substrate and a processing chamber by the high-frequency electric field applied to the substrate or the difference in mobility between the electrons and ions in plasma is not considered. Even if a frequency which could be followed by ions was determined as the high frequency applied to the substrate, a surplus DC potential would be induced in the substrate. This results in a problem that discharge caused between the substrate and the plasma by this surplus induced potential might severely damage the substrate. In a fabrication process for semiconductor devices, there was posed a problem that element characteristics were degraded by storage of a charge due to induced potential. Further, if power applied to the substrate was increased to improve the plasma processing efficiency, the potential induced in the substrate was also raised accordingly. This resulted in a problem that improvement of processing efficiency was prohibited.

Further, when discharge was caused in the plasma by the high-frequency electric field applied to the substrate, the gap between the substrate and a substrate holder to which the high-frequency electric field was applied formed a large impedance component in this frequency region. This resulted in a problem that uniformity of plasma processing in a substrate or between substrates was poor.

These problems will now be described in more detail.

When a high frequency is applied to a substrate, electrons and ions contained in a plasma are moved in a direction nearly perpendicular to the substrate by the high-frequency electric field. As well known, however, there occurs a difference between the amount of electrons impinged on the substrate and the amount of ions impinged on the substrate because of a difference in mobility based upon mass and a difference in frequency of collision based upon the diameters of particles.

The above described difference becomes small when a frequency which can be followed by the ions (such as a frequency of 1 MHz or less in case of $N^+$ and $O^+$) is applied. By the difference in amount of impingement, however, a DC potential which is not higher than 20 V in absolute value with respect to the plasma potential is induced in the substrate. On the other hand, electrons and ions are forced to move by the high-frequency electric field and collide with other particles. When power applied to the substrate is large, the acceleration of electrons and ions is also large and collided particles are ionized, resulting in momentary discharge. If at this time electrons or ions flow out of the plasma and the plasma is in contact with the internal wall of the processing chamber coupled to the ground potential, for example, the electrons or ions flow into the ground through the internal wall and hence electron avalanche is caused, high-frequency discharge being thus maintained. If electron avalanche occurs, the ratio of the above described amounts of impingement changes little. Since the absolute value of the difference in amount of impingement increases exponentially, however, the DC potential induced in the substrate amounts to $-10^2$ to $-10^3$ V. When discharge occurs, power applied to the substrate is consumed in order to maintain the discharge, i.e., as a current flowing to the substrate and the internal wall of the processing chamber via the plasma. As a result, the DC potential induced in the substrate becomes high. However, the high-frequency potential applied to the substrate decreases in proportion to the power consumed by the discharge. If new discharge is caused by the high frequency applied to the substrate, a highly negative DC potential causing damage of the substrate is induced. If the DC potential induced in the substrate becomes high in absolute value, a local discharge corresponding to a so-called falling of a thunderbolt may occur between the plasma and the substrate and severely damage the substrate, or charge up of the substrate based upon the induced DC potential may cause damage or deterioration of elements formed on the substrate, resulting in problems.

SUMMARY OF THE INVENTION

An object of the present invention is to provide an ECR plasma processing method, and apparatus, which is capable of overcoming the above described problem.

More specifically, an object of the present invention is to provide an ECR-plasma processing method, and apparatus, which has excellent processing efficiency and processing uniformity.

In accordance with a feature of an ECR-plasma processing method, and apparatus, according to the present invention achieving the above described object, occurrence of discharge caused by a high-frequency electric field applied to a substrate is prohibited. To be more specific, the following conditions 1) and 2) must be met.

1) High-power high-frequency electric field is not applied to the substrate so that such strong acceleration as to cause ionization may not occur. That is to say, at least, the power must not exceed such a value that the plasma disappears when means for generating plasma is stopped.

2) The inner wall of the processing chamber and the holder are covered by an insulating material so that a large current, or a DC current at least may not flow between the internal wall of the processing chamber and the substrate holder via the plasma in order to prevent discharge from continuing even for a moment.

That is to say, such a high-impedance state that an applied high-frequency current hardly flows through the plasma is formed.

Further, it is effective in further reducing in absolute value the induced DC potential degrading the element characteristics and in preventing discharge to 3) define a potential different from the ground potential as the potential of the substrate holder for applying the high-frequency electric field to the substrate and float the reference potential of the high-frequency electric field or make it equivalent to the potential of the plasma.

For further lowering the induced DC potential itself, it is necessary to 4) reduce the distance between the principal plasma generating position and the substrate to the side of the mean free path of ions at least (such as, for example, 200 mm when the pressure in the processing chamber is 0.1 Pa and 2 mm when the pressure in a processing chamber is 10 Pa) in order to reduce the difference in amount of impingement against the substrate between the electron and ion.

In case at least one of the combination of the above described means (1) and (2) and the combination of the above described means (2) and (3) is executed, the occurrence of discharge is suppressed or the DC potential induced in the substrate is significantly reduced in absolute value, the object of the present invention being thus achieved.

Further, it is known that the film quality in formation of an oxide film or a nitride film is improved as the amount of excited ions impinged on the substrate is increased as described in Japanese Journal Applied Physics, Vol. 27, No. 10 (1988) pp L1962–L1965 and Vol. 28, No. 6 (1989), pp 1035–1040, for example. When the above described means 4) is executed, therefore, excited ions generated at the principal plasma generating position can be directly impinged on the substrate. As a result, an oxide film or a nitride film having especial high quality is obtained.

A frequency which is not lower than 10 Hz and not higher than 1 MHz is suitable as the frequency of the high-frequency electric field applied to the substrate for raising the processing efficiency. Assuming that the kind of ions is $O_2$ or Ar and the distance between the plasma generating face (ECR face) and the substrate to be processed is within the mean free path (20 cm for $O_2$ with 0.1 Pa and 12 cm for Ar with 0.1 Pa), the suitable frequency is not lower than 300 kHz and not higher than 500 kHz and the optimum frequency is 400 kHz for $O_2$ whereas the suitable frequency is not lower than 50 kHz and not higher than 200 kHz and the optimum frequency is 150 kHz for Ar.

As the insulating material, various materials such as quartz and alumina ceramics can be used. The film thickness required for attaining insulation with respect to a high frequency of 13.6 MHz is 0.1 mm at least.

BRIEF DESCRIPTION OF THE DRAWINGS

FIG. 2 is a characteristic curve diagram showing dependence of magnetic flux density upon the distance from the tip of a microwave lead-in window;

FIG. 25 is a schematic diagram showing still yet another embodiment of a microwave plasma processing apparatus according to the present invention;

DESCRIPTION OF THE PREFERRED EMBODIMENTS

Embodiments of the present invention will hereafter be described in detail by referring to drawings.

EXAMPLE 1

Figure 1:
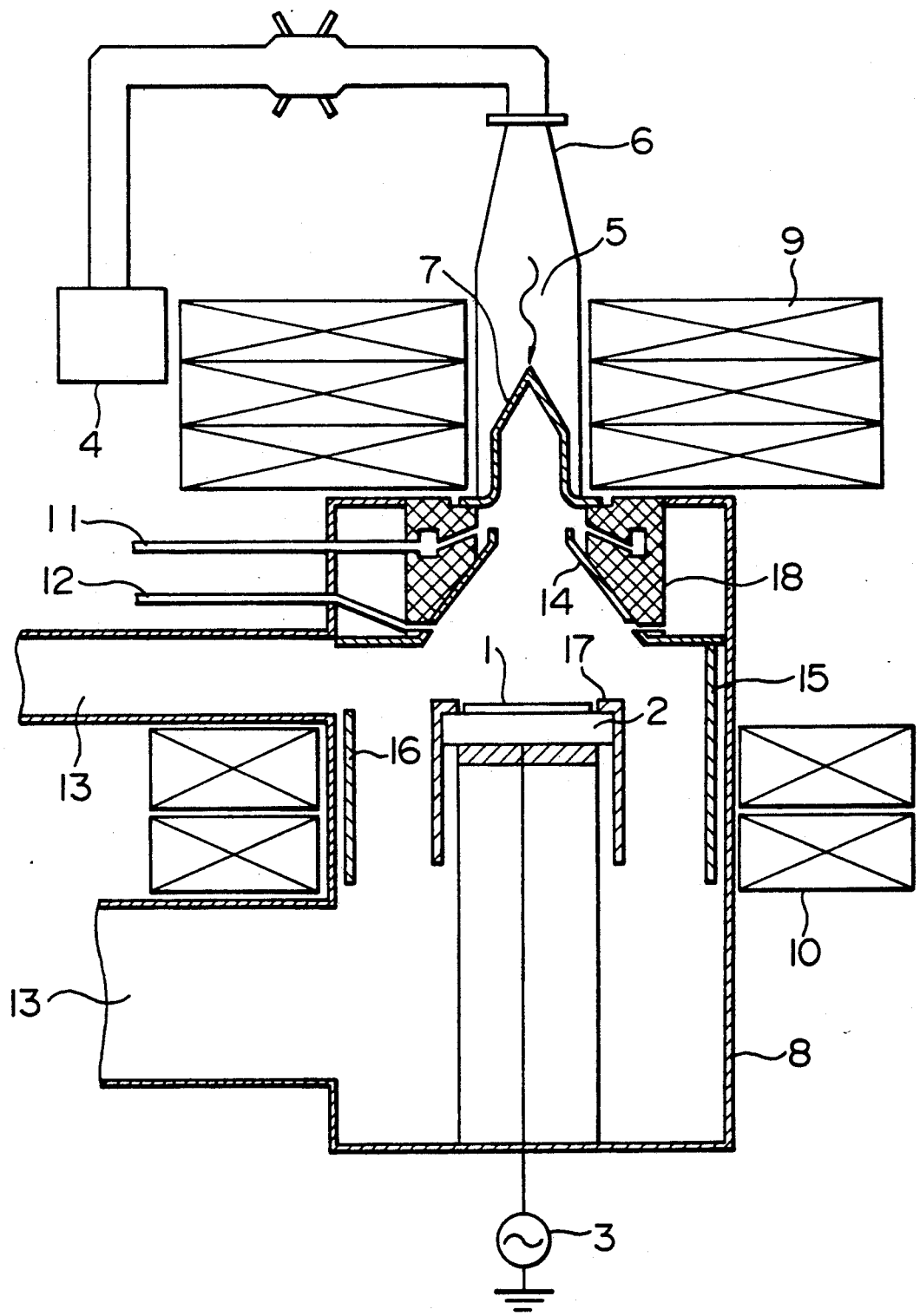
FIG. 1 is a schematic diagram showing an embodiment of a microwave plasma processing apparatus.

FIG. 1 is a schematic diagram of a principal part of a microwave plasma processing apparatus which is one form of the present invention. The present apparatus comprises a substrate holder 2 made of Al for conveying a high frequency to a substrate 1 to be processed, high-frequency power supply 3, a microwave guide 6 for guiding microwave energy (2.45 GHz) from a magnetron 4 to a discharge tube 7 being, the discharge tube 7 made of quartz and having a top cone-shaped portion serving as a microwave lead-in window, a plasma processing chamber 8 which is a vacuum container vacuum-separated from the microwave guide 6 by the discharge tube 7, a main magnetic field coil 9 for generating ECR, an additional magnetic field coil 10 for moving the ECR face, a reaction gas blowoff pipe 12, a plasma gas blowoff pipe 11, an exhaust port 13 (an exhaust system such as an exhaust pump is not illustrated), and quartz walls 14, 15 and 16 for insulating the internal walls of the processing chamber. The main magnetic field coil 9 and the additional magnetic field coil 10 are disposed in the periphery of the discharge tube 7 and the processing chamber 8. The maximum magnetic flux density in the discharge tube is 2.6 KGauss. The distribution of magnetic flux density can be controlled by the values of the currents which are caused to flow through respective coils. The surface of the substrate holder 2 is coated with alumina. With the exception of a face whereon the substrate 1 is disposed, the surface of the substrate holder is covered by a quartz cove 17. Numeral 18 denotes a barrel for preventing diffusion of microwave energy and which is made of stainless steel. FIG. 2 shows the distribution of magnetic flux density in the central axis direction of the apparatus as a function of distance from the tip of the microwave lead-in window indicated by the abscissa. The magnetic flux density can be changed from a curve 19 to a curve 20 by adjusting current values of the main magnetic field coil and the additional magnetic field coil. That is to say, the ECR face can be moved from 300 mm above the substrate to 0 mm above the substrate.

Figure 3:
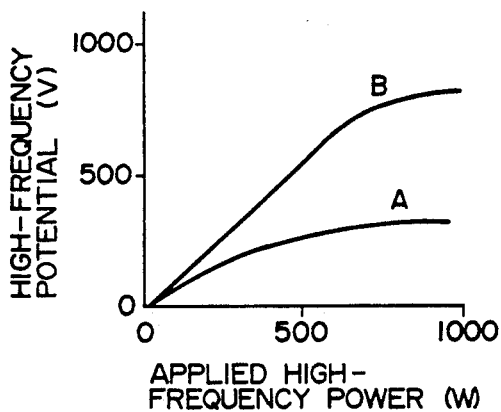
FIGS. 3, 4, 5 and 6 are characteristic curve diagrams showing dependence of high-frequency potential, induced DC potential, electron density and sputtering rate upon applied high-frequency power, respectively.
Figure 4:
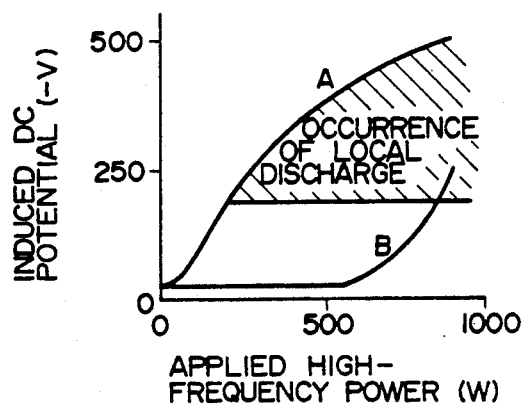
Figure 5:
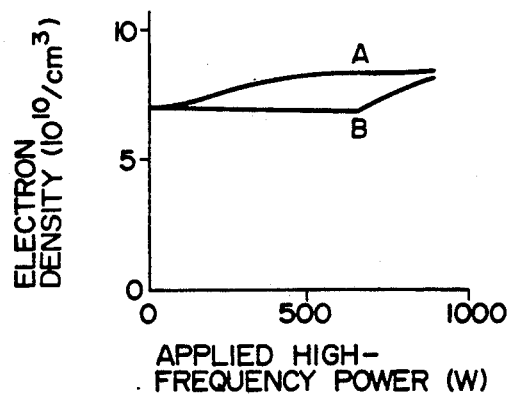
Figure 6:
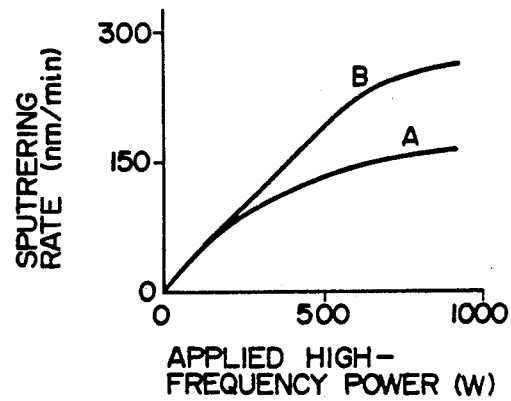

A silicon wafer having a diameter of 100 mm and a thermal oxidized $SiO_2$ film having a thickness of 0.5 μm formed on the silicon wafer were used as the substrate 1 to be processed. Ar gas was introduced from the gas nozzle 11 with a rate of 100 ml/min until the pressure within the processing chamber reached 0.2 Pa. Microwave energy 5 of 2.45 GHz and 600 W was introduced into the discharge tube 7. A magnetic field not less than 875 Gauss was generated by the magnetic field coils 9 and 10. $SiO_2$ film was thus subjected to sputter-etching by Ar. At this time, the distance between the substrate and the ECR face was defined as 150 mm, and the frequency applied to the substrate was defined as 400 kHz. FIG. 3 shows dependence of high-frequency potential applied to the substrate ranging from the reference potential (ground potential) to the peak potential upon the applied power. An illustrated curve B represents the value of high-frequency potential obtained when the insulating walls 14 to 16 are present, whereas a curve A represents the value of high-frequency potential obtained when the insulating wall 14 is not present. FIG. 4 shows the DC potential induced in the substrate at this time. FIG. 5 shows the value of electron density at the substrate position measured by using the probe method. As seen from these drawings, the applied high-frequency potential rises but tends to be saturated as the power is increased when the insulating wall 14 located above the top face of the substrate is omitted. The induced DC potential rises when the applied power exceeds approximately 50 W. As a high-frequency electric field is applied to the substrate and its power is increased, the electron density increases. It is understood from this that discharge occurs when power of the applied high frequency exceeds nearly 50 W. When the induced DC potential exceeds nearly −250 V, local discharge occurs between the substrate and plasma and the substrate is thus damaged. When power of the high-frequency electric field applied to the substrate is not less than 50 W in case of A, discharge is sustained even if the introduction of the microwave energy is stopped. Discharge is not stopped until application of the high-frequency electric field to the substrate is stopped. In case of B wherein the inside of the processing chamber 8 is sufficiently insulated, the high-frequency potential rises in proportion to the applied power until the applied power reaches 600 W whereas the induced DC potential is approximately −15 V and constant and the electron density is also constant. That is to say, it is known that discharge due to the high-frequency electric field applied to the substrate is not caused. Since the electron density increases when the applied power exceeds nearly 600 W, however, it is known that high-frequency discharge occurs. When applied power exceeds 600 W, the high-frequency potential begins to be saturated and the induced DC potential significantly rises. When the applied power is 850 W, local discharge occurs in the substrate. FIG. 6 shows the sputtering rate of the $SiO_2$ film at this time. It is understood that the sputtering rate in case of B wherein discharge is not caused is larger than that of the case A because the high-frequency electric field applied to the substrate can be effectively used in case of B. It is understood from these results that even if a frequency which can be followed by ions is applied to the substrate, introduction of applied power exceeding a certain degree causes high-frequency discharge and hence saturates the high-frequency potential in any of case A and B, resulting in a high induced DC potential, which may damage the substrate by local discharge and reduce the ion processing efficiency. If portions of the inside of the processing chamber 8 which are in contact with the plasma are covered by an insulating material, the occurrence of discharge can be suppressed and a high-frequency electric field having a relatively high power can be applied without causing a discharge. Therefore, a highly negative DC potential is not induced in the substrate, and a higher high-frequency potential can be used. As a result, ion processing of high efficiency can be performed without damaging the substrate.

EXAMPLE 2

Figure 7:
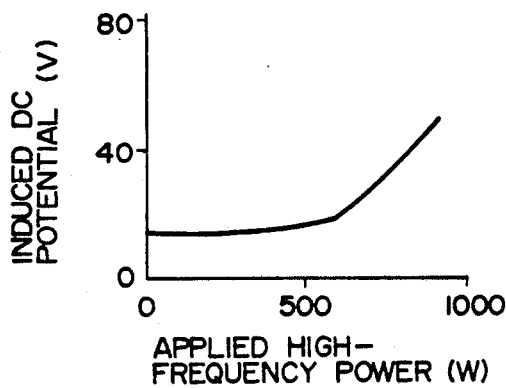
FIGS. 7 and 8 are characteristic diagrams showing dependence of induced DC potential and frequency shift value $\Delta qss$ of interface level at the time of $SiO_2$ film formation upon applied high-frequency power, respectively.
Figure 8:
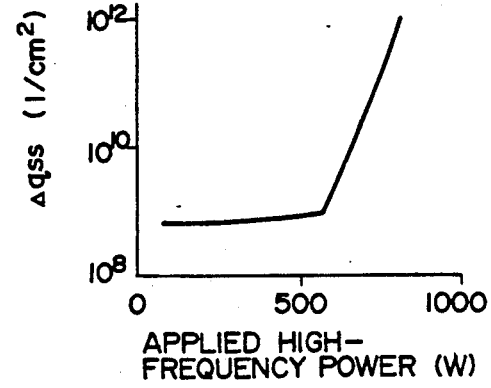

By introducing oxygen at a rate of 100 ml/min via the plasma gas supply nozzle 11 and monosilane $SiH_4$ gas at a rate of 20 ml/min via the reaction gas nozzle 12, an $SiO_2$ film having a thickness of 0.3 μm was formed on a p-type silicon substrate. Other conditions are the same as those of B of the example 1. FIG. 7 shows the dependence of DC potential induced in the substrate upon high-frequency power. When the applied power exceeds nearly 600 W, the induced DC potential abruptly rises. With reference to FIG. 8, an Al electrode of 0.8 μm was formed on a deposited $SiO_2$ film, and the interface level was derived from evaluation of C-V characteristics of the Al electrode and the Si substrate. The frequency shift Δqss of interface level was then calculated by using the expression Δqss=qss at 10 MHz−qss at 100 kHz. FIG. 8 shows the value of Δqss thus derived as a function of the applied power. When the applied high-frequency power exceeds 600 W, i.e., when the induced DC potential begins to rise, the frequency shift value Δqss of interface level abruptly rises. It is known that a significantly large amount of electric charge has been stored in the film. When the applied power is increased from 600 W to 800 W, the induced potential rises from −18 V to −38 V only by nearly twice. From FIG. 8, however, it is known that the amount of stored electric charge has increased to 900 times or more at this time. Therefore, it is known that the DC potential induced in the substrate must be reduced in order to prevent degradation of electrical characteristics in the formed film. For this purpose as well, it is necessary to suppress the occurrence of high-frequency discharge.

EXAMPLE 3

Figure 9:
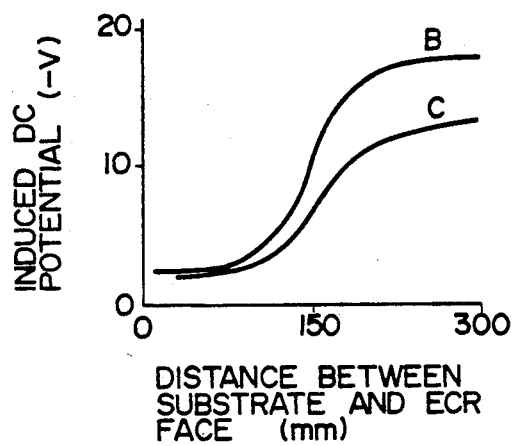
FIGS. 9 and 10 are characteristic curve diagrams showing dependence of induced DC potential and $\Delta qss$ at the time of $SiO_2$ film formation upon distance between the substrate and ECR face, respectively.
Figure 10:
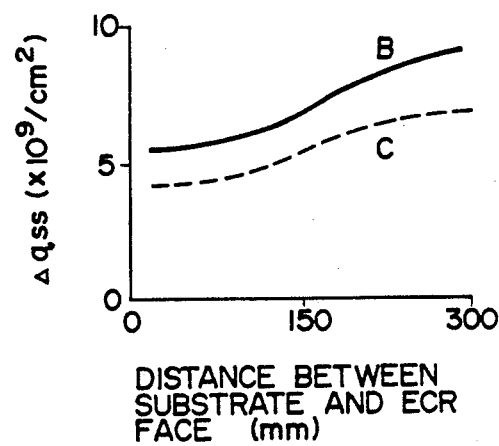

By using the apparatus of FIG. 1, the distance between the substrate and the ECR face was varied from 20 to 300 mm by adjusting the current values of the main magnetic field coil 9 and the additional magnetic field coil 10. With the high-frequency power applied to the substrate fixed to 400 W, an $SiO_2$ film was formed under the same condition as that of the example 2. FIGS. 9 and 10 show dependence of the DC potential induced in the substrate and Δqss evaluated in the example 2 upon the distance between the substrate and the ECR face, respectively. Illustrated curves B represent the case where the reference potential of the applied high frequency is the ground potential, whereas curves C represent the case where the reference potential of the high-frequency electric field is caused to float by inserting a capacitor between the high-frequency power supply 3 and the ground potential. It is understood from FIG. 9 that the induced potential significantly lowers in absolute value when the ECR position is brought close to the substrate. It is also understood that the mean free path of oxygen ions becomes approximately 150 mm at 0.15 Pa and the induced potential lowers especially in this mean free path. It is also understood that when the potential of the substrate floats, the induced potential further lowers as compared with that obtained when the substrate is coupled to the ground potential.

As evident from FIG. 10, the amount of electric charge stored in the film decreases when the potential of the substrate floats as the ECR face approaches the substrate, i.e., as the DC potential induced in the substrate is lowered in absolute value. It is understood from these facts that when the ECR face which is the principal plasma generating position of microwave plasma is brought close to the substrate so that the ECR face may be positioned within the distance of the mean free path of the ions, the difference between the amount of electrons impinged on the substrate and the amount of ions impinged on the substrate is significantly reduced and hence the induced DC potential is lowered in absolute value. It is also understood that the potential difference itself between the plasma and substrate is reduced by making the substrate have a floating potential. It is thus understood that the film can be formed without degrading the electrical characteristics provided that the DC potential induced in the substrate is lowered in absolute value.

EXAMPLE 4

Figure 11:
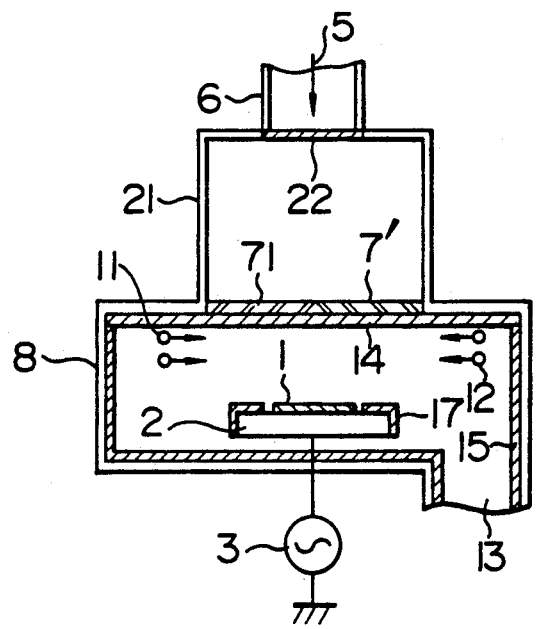
FIG. 11 is a schematic diagram showing another embodiment of a microwave plasma processing apparatus according to the present invention.
Figure 12:
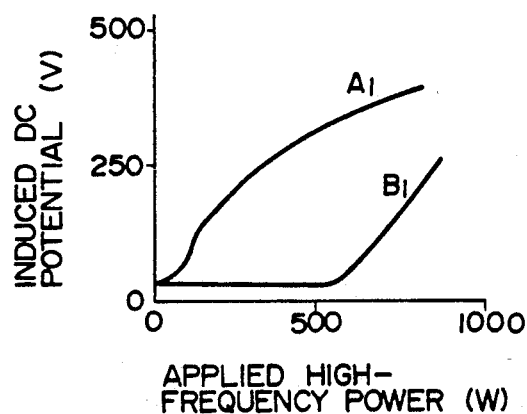
FIGS. 12 and 13 are characteristic curve diagrams showing dependence of induced DC potential of oxygen gas plasma upon applied high-frequency power and dependence of induced DC potential of oxygen gas plasma upon the distance between a microwave lead-in window and the substrate, respectively.
Figure 13:
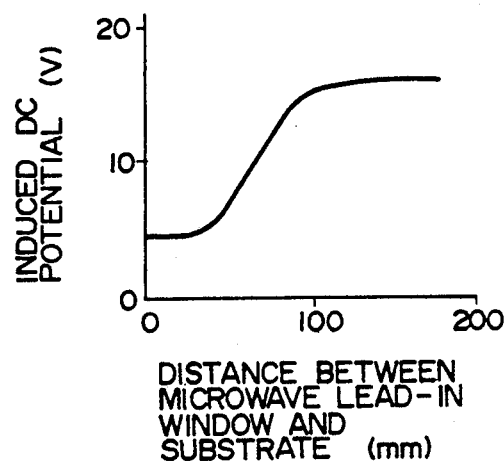

FIG. 11 shows a sectional view of a principal part of a microwave plasma apparatus of resonance type which is one form of the present invention. Microwave energy 5 is introduced into a resonance box 21 made of metal through a quartz window 22 by a waveguide 6. The microwave energy having electric field strength intensified by resonance is led into a processing chamber 8 through a microwave lead-in window 7' which is made of quartz or sapphire and formed with radial slits 71 for making the electric field mode single, plasma being thus generated. The substrate holder 2 can move upward and downward. Other numerals shown in FIG. 11 denote components having the same functions as those of FIG. 1. Characteristics in application of high frequency power of this apparatus were experimentally studied by using oxygen gas. The experimental study was performed by introducing oxygen gas from the gas nozzle 11 at the rate of 200 ml/min, decompressing the processing chamber 8 to 0.5 Pa and defining the introduced microwave power as 300 W. FIG. 12 shows dependence of induced DC potential upon the high-frequency power applied to the substrate under the condition that the substrate is at a distance of 100 mm from the microwave lead-in window. Curve $A_1$ corresponds to the case where an insulating plate 14 of quartz disposed above the substrate in the processing chamber is removed. Curve $B_1$ corresponds to the case where the insulating plate 14 is present. When the insulating plate 14 is not present ($A_1$), high-frequency discharge occurs and the induced potential significantly rises in absolute value for the applied power exceeding nearly 50 W. At this time, high-frequency discharge did not disappear even if introduction of the microwave energy 5 was stopped. In case the inside of the processing chamber was insulated ($B_1$), discharge was not found until the applied power reached 500 W. Under the condition that the high-frequency applied power is 400 W in the situation $B_1$, FIG. 13 shows the induced DC potential as a function of the distance between the microwave lead-in window and the substrate. The mean free path of oxygen ions is approximately 40 mm at 0.5 Pa. The principal plasma generating position of the present apparatus becomes the microwave lead-in window portion. It is understood that the induced DC potential can be lowered in absolute value when the substrate is brought at least within the mean free path of oxygen ions in the same way as the result of the preceding example. Then $SiH_4$ was introduced via the gas nozzle at a rate of 20 ml/min to form the $SiO_2$ film and Δqss was examined. Under the condition that the substrate was at a distance of 100 mm from the microwave lead-in window, Δqss was less than $8\times10^9/cm^2$ when discharge did not occur, i.e., when the applied high-frequency power was not larger than 50 W for A1 and when the applied high-frequency power was not larger than 500 W for $B_1$. When the applied power exceeded the above described value, however, Δqss became not less than $1\times10^{10}/cm^2$. Further, when the substrate was positioned at a distance of 40 mm from the microwave in Window in case of $B_1$, Δqss became Δqss=$4\times10^9/cm^2$. It is understood from these facts that it is important in microwave plasma apparatuses of the resonance type as well to prevent occurrence of high-frequency discharge at least and lower in absolute value the DC potential induced in the substrate.

EXAMPLE 5

Figure 14:
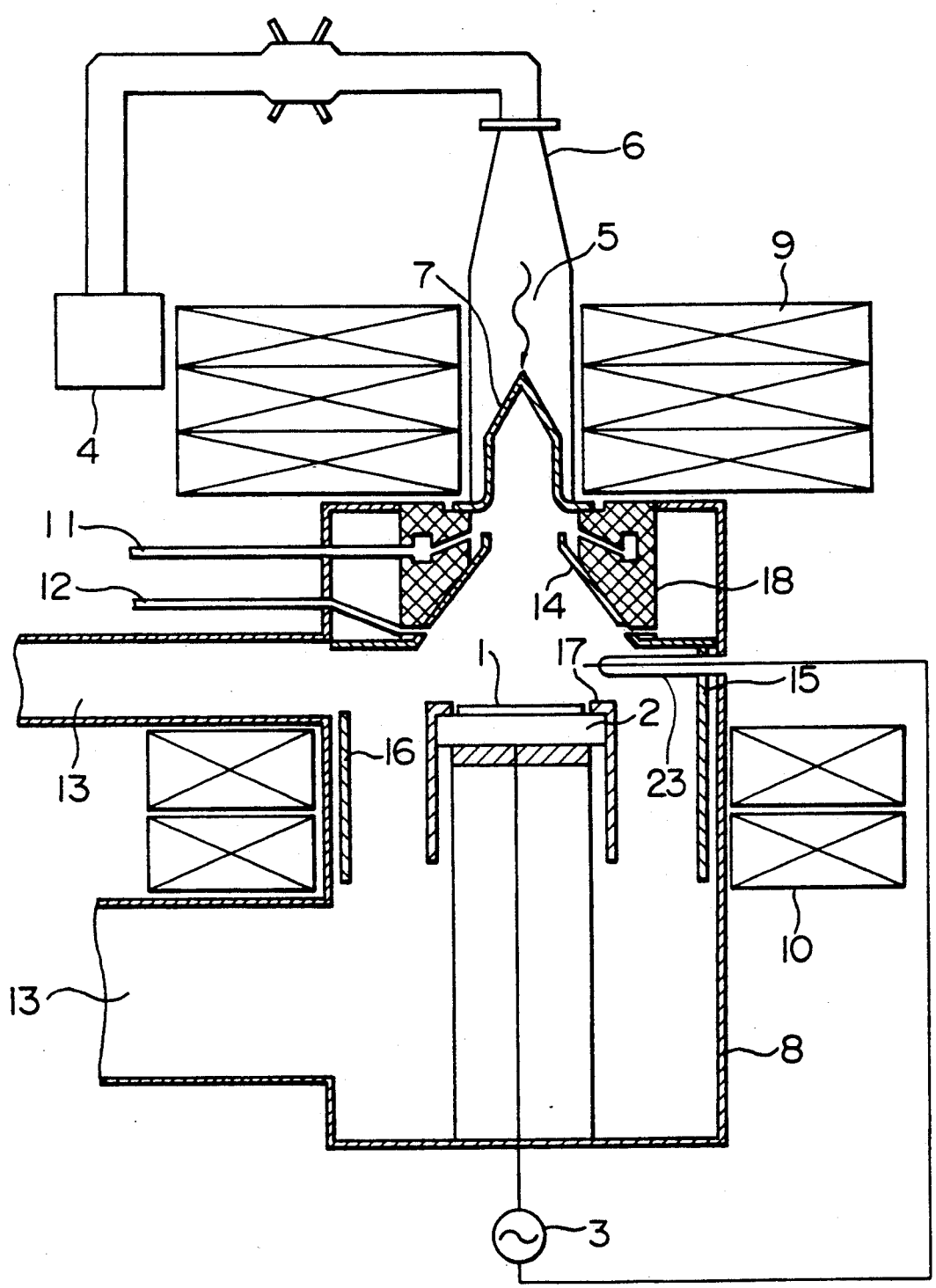
FIG. 14 is a schematic diagram showing still another embodiment of a microwave plasma processing apparatus according to the present invention.

When the reference potential of the high-frequency electric field applied to the substrate was defined as the plasma potential, Δqss of the formed film was examined. The apparatus which was used to form the film is shown in FIG. 14. The apparatus of FIG. 14 differs from the apparatus of FIG. 1 in that a probe 23 is so disposed near the ECR face as to be in contact with the plasma and the probe 23 is so connected to the high-frequency power supply 3 that the potential of this probe 23 ma become the reference potential of the high-frequency power supply 3. With the exception of the fact that the distance between the ECR face and the substrate was fixed to 150 mm, the same condition as that of the example 3 was used. Under the condition that the distance between the ECR face and the substrate was 150 mm, Δqss of the formed $SiO_2$ film was $7.0 \times 10^{19}$ cm$^{-2}$ when the reference potential of the high-frequency electric field was ground potential whereas Δqss was $5.4 \times 10^{19}$ cm$^{-2}$ when the reference potential was a floating potential as shown in FIG. 10. When the plasma potential was used as the reference potential, Δqss was $3.9 \times 10^{19}$ cm$^{-2}$. The DC potential induced in the substrate at this time was not higher than 1 V in absolute value.

As evident from this result, the film formed by using the floating potential as the reference potential of the high-frequency electric field applied to the substrate is superior in interface characteristics to the film formed by using the ground potential as the reference potential. Further, the film formed by using the plasma potential as the reference potential is superior in interface characteristics to the film formed by using the floating potential as the reference potential.

EXAMPLE 6

Figure 15:
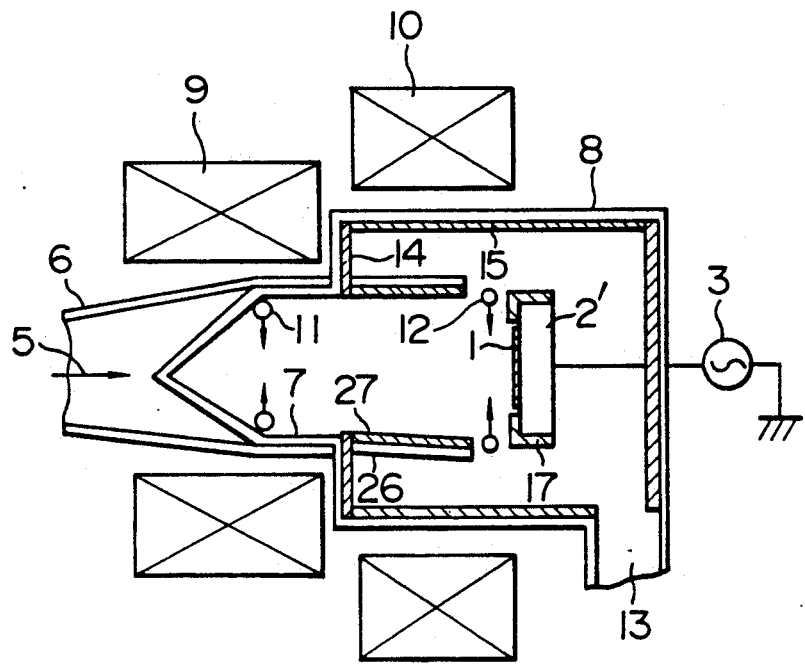
FIG. 15 is a schematic diagram showing yet another embodiment of a microwave plasma processing apparatus according to the present invention.
Figure 16:
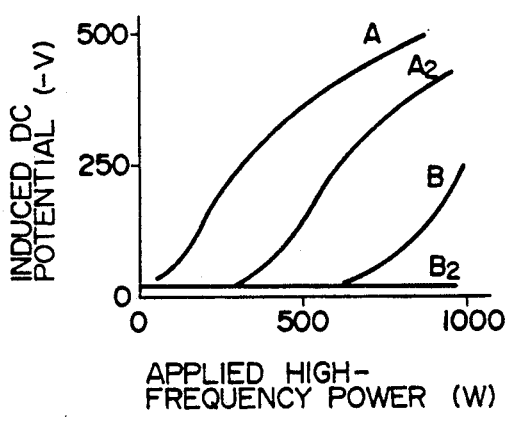
FIG. 16 is a characteristic cure diagram showing dependence of induced DC potential upon applied high-frequency power.

FIG. 15 shows the sectional view of a principal part of a microwave plasma processing apparatus which is a form of the present invention. This apparatus has a feature that a microwave diffusion preventing barrel 26 made of aluminum and having an insulating barrel 27 made of quartz or alumina is disposed in the processing chamber in the direction of the magnetic line of force. Even if the ECR face is positioned in the processing chamber 8, therefore, the ECR can be constrained within the preventing barrel 26 and plasma can be applied to nearly only the substrate face. FIG. 16 shows the result of measurement of DC current induced in the substrate performed under the same condition as that of the example 1 and plotted with respect to the applied high-frequency power. Illustrated curve $A_2$ represents the result of measurement performed when the upper insulating plate 14 is not present, whereas curve $B_2$ represents the results of measurement performed when the insulating plate is present. For reference, values obtained when the microwave diffusion preventing barrel 26 is not present, i.e., the curves A and B of the example 1 are also shown. It is understood from FIG. 16 that occurrence of high-frequency discharge can be suppressed provided that the area through which the plasma flows is restricted as indicated by $A_2$ and $B_2$. Further, the diameter direction of plasma flow is reduced and plasma diffusion is eliminated. Accordingly, the processing efficiency has been improved. It is understood that high-frequency discharge can be suppressed and ion processing efficiency can also be improved by thus controlling the plasma flow.

EXAMPLE 7

Figure 17:
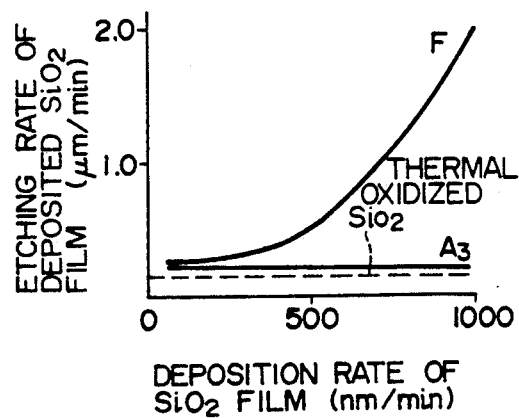
FIGS. 17 and 18 are characteristic curve diagrams showing dependence of etch rate of deposited $SiO_2$ film and infrared absorption center wave number of Si-O bond upon deposition rate of $SiO_2$ film, respectively.
Figure 18:
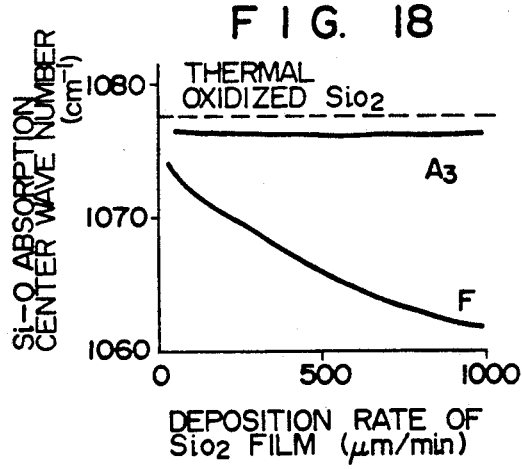
Figure 19:
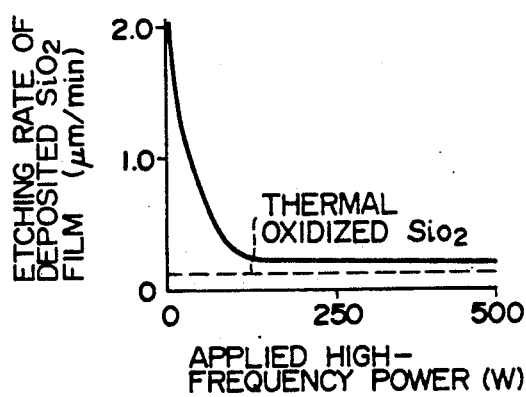
FIGS. 19 and 20 are characteristic curve diagrams showing dependence of etching rate of the deposited $SiO_2$ film and infrared absorption center wave number of Si-O bond upon the applied high-frequency power, respectively.
Figure 20:
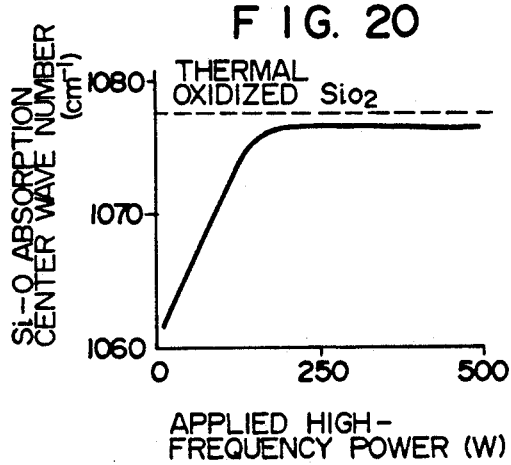
Figure 21:
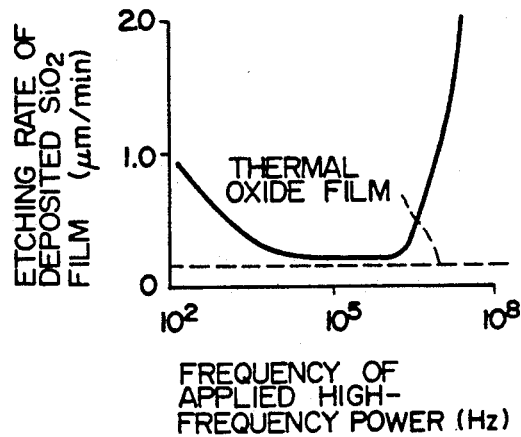
FIGS. 21 and 22 are characteristic curve diagrams showing dependence of etching rate of the deposited $SiO_2$ film and infrared absorption center wave number of Si-O bond upon the frequency of applied high frequency power, respectively.
Figure 22:
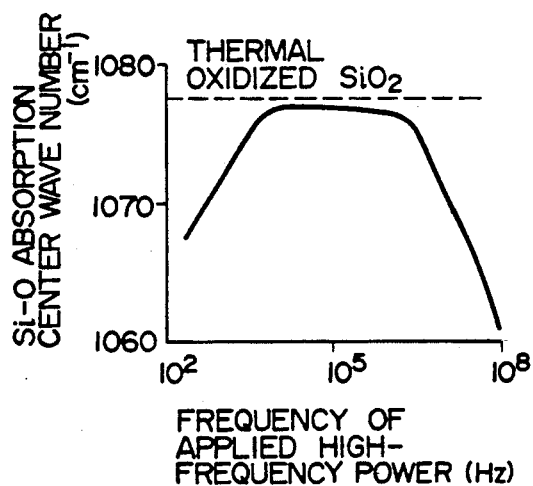
Figure 23:
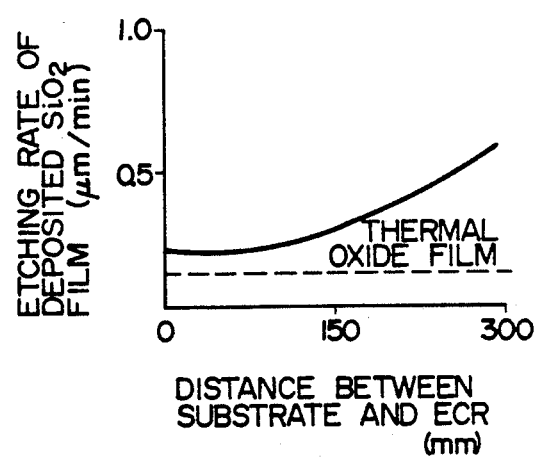
FIGS. 23 and 24 are characteristic curve diagrams sowing dependence of etching rate of the deposited $SiO_2$ film and infrared absorption center wave number of Si-O bond upon the distance between the substrate and ECR face, respectively.
Figure 24:
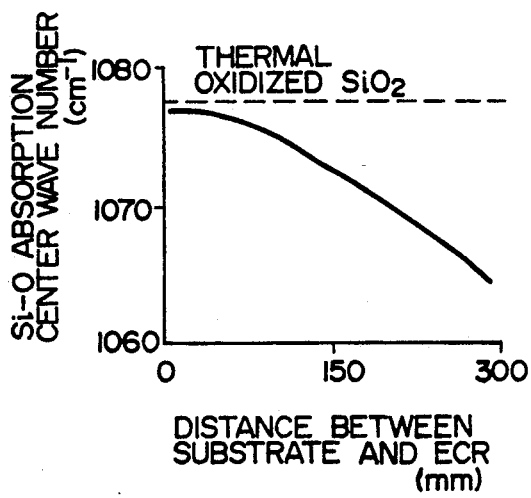

By using the apparatus of the Example 6, introducing oxygen via the gas lead-in nozzle 11 at a rate of 300 ml/min, introducing $SiH_4$ via the nozzle 12 at the rate of 1 to 60 ml/min, decompressing the inside of the processing chamber to 0.3 Pa, the $SiO_2$ film was formed. The introduced microwave power was defined as 600 W and the distance between the substrate and ECR was defined as 100 mm. FIGS. 17 and 18 show the dependence of the etching rate of a deposited $SiO_2$ film with buffer fluoric acid solution and the infrared absorption center frequency of the Si-O bond upon the deposition rate of the $SiO_2$ film, respectively. Illustrated curves $A_3$ represent values obtained by measurement made under the condition of the example 6 and under the condition that the applied high-frequency power is 300 W. Curves F represent values obtained by measurement made under the condition that high frequency is not applied. When the high frequency is not applied, it is understood that the etching rate becomes large, i.e., the film becomes significantly coarse and the infrared absorption center wave number of the Si-O bond lowers, i.e., the Si-O bond becomes weak as the deposition rate is increased. When the high frequency is applied, the film has minuteness of the thermal oxidation film and high Si-O bonding strength even if the deposition rate is large. FIGS. 19 and 20 respectively show the dependence of the etching rate and the infrared absorption center wave number of the Si-O bond upon the applied high-frequency power when the deposition rate is 1000 mm/min. Even if the applied power is as low as 100 W, the minuteness of the deposited film is significantly improved and the Si-O bonding strength is also improved. FIGS. 21 and 22 show the dependence of the etching rate and the infrared absorption center wave number of the Si-O bond upon the applied high frequency under the condition that the high-frequency power is 300 W. It is understood that the minuteness of the deposited film and the bonding strength become rather lower when the frequency is not less than nearly $10^6$ Hz. The use of a frequency not higher than $10^6$ Hz proves to be desirable when a film is to be formed. FIGS. 23 and 24 respectively show the dependence of the etching rate and the infrared absorption center wave number of the Si-O bond upon the distance between the substrate and the ECR.

It is understood from this result that the amount of impinged ions can be increased and a film of higher quality can be formed as the substrate is brought close to the ECR position. As heretofore described, plasma processing comprising substrate processing performed while applying a frequency which can be followed by ions provides a large effect in film formation.

EXAMPLE 8

As a substrate to be processed, a semiconductor element compositing Al wiring so formed on a Si substrate as to have width of 1.0 μm was used. On this element, a flattened $SiO_2$ film was formed by using the apparatus shown in FIG. 15. As sputter ions for flattening, oxygen ions were used. The applied frequency, introduced microwave power, applied high-frequency power, and the distance between the substrate and ECR were defined as 400 kHz, 600 W, 600 W and 100 mm, respectively. Other conditions were defined as those of $A_2$ and $B_2$ of the example 6. 100 sheets were thus processed. In case discharge occurred ($A_2$), the mean flattening rate was 200 nm/min. The maximum error within the substrate was 23%. The maximum error between substrates occurred between the first sheet and 100-th sheet and was as high as 23%. The yield of element formation was 3%. In case discharge did not occur ($B_2$), the mean flattening rate was 310 nm/min and the maximum error within the substrate and between substrates was within 5%. The yield of element formation was 88%. As understood from these results, excellent processing characteristics, uniformity, reproducibility, little damage and high processing efficiency are attained when high-frequency discharge is not caused.

EXAMPLE 9

As the substrate to be processed, a 100 mm square glass substrate having Cr wiring was used. By using the apparatus shown in FIG. 1, nitrogen gas was let flow from the gas nozzle 11 onto the substrate instead of oxygen to form a SiN film. The high-frequency power applied to the substrate was defined as 200 W. The number of sheets to be processed was defined as 50. Other conditions were identical with those of $A_2$ and $B_2$ of the example 6. The sputter effect was used to improve the film quality of the side wall of Cr wiring. Thereafter, a nondope Si film and a phosphor Si film were continuously formed by using another apparatus. Thereafter, predetermined processing was executed, and a liquid crystal display having 1000×1000 scanning lines was fabricated. The yield of scanning lines was then examined. In case a high-frequency discharge occurred, the yield of scanning lines was 30%. In case discharge was prevented from occurring, however, the yield of scanning lines became 86%. In fabrication of TFT as well, the yield can be significantly improved by preventing high-frequency discharge.

EXAMPLE 10

As the substrate to be processed, a thermal oxide $SiO_2$ film having the thickness of 100 nm formed selectively at a given pattern on a silicon wafer was used. Etching of the oxide film was performed by the apparatus shown in FIG. 15. $CHF_3$ was used as reaction gas and introduced from the gas nozzle 11 at a rate of 30 ml/min. High-frequency power applied to the substrate was defined as 200 W. Other conditions were so defined as to be identical with those of $A_2$ and $B_2$ of the Example 8. In case high-frequency discharge occurred ($A_2$), the etching rate was 120 nm/min and the selectivity ratio or the ratio of the rate in etching of $SiO_2$ film to the rate in etching of the underlying Si substrate was 8. In case high-frequency discharge did not occur ($B_2$), however, the etching rate was 200 nm/min and the selectivity ratio of the etching rate of $SiO_2$ with respect to the etching rate of the underlying Si substrate became 15. As understood from this result, the etching rate lowers in case the high-frequency potential is lowered by discharge or DC potential is induced by discharge. Further, the selectivity ratio is lowered by charge up of the substrate. As understood from these facts, prevention of high-frequency discharge and reduction in absolute value of potential induced in the substrate exert a large influence upon etching as well.

EXAMPLE 11

A silicon wafer was used as the substrate to be processed. Phosphine $PH_3$ was introduced from the gas nozzle 11 at a rate of 10 ml/min by using the apparatus shown in FIG. 15. Doping of phosphorus was then performed for 10 minutes. Other conditions were so defined as to be identical with those of the example 10, and the dose rate was examined. In case discharge occurred ($A_2$), the dose rate was $3 \times 10^{13}$ cm$^{-2}$. In case discharge did not occur ($B_2$), the dose rate becomes as high as $1 \times 10^{15}$ cm$^{-2}$. As understood from this result, the amount of doping can be significantly improved by effectively using the high-frequency potential applied to the substrate without causing discharge.

EXAMPLE 12

As the substrate to be processed by using the apparatus of FIG. 15, a polycarbonate plate having a diameter of 100 mm and thickness of 1 mm was used. Ammonia $NH_3$ was introduced from the gas nozzle 11 at a rate of 50 ml/min. The substrate underwent ammonia processing for one minute. Succeedingly, $SiH_4$ was introduced from the gas nozzle 12 at a rate of 5 ml/min. On the substrate which had undergone ammonia processing and cleaning, a silicon nitride film was deposited by 100 nm. Close adhesion force between the polycarbonate material and the silicon nitride film was examined. Other conditions were so defined as to be identical with those of the example 11. Evaluation of the close adhesion force was performed by applying an accelerated deterioration test to the wafer after the film deposition in an atmosphere of 60° C. and 90% RH for 6000 hours and visually observing the peeling at that time. For reference, the condition that high frequency is not applied to the substrate is also added as (F). In case the high frequency was not applied to the substrate (F), peeling of the film occurred when 200 hours have elapsed. In case the high frequency was applied to the substrate and discharge occurred ($A_2$), peeling of the film did not occur until 1000 hours elapsed. In case the high frequency was applied and discharge was not caused ($B_2$), peeling of the film did not occur until 5000 hours elapsed. As understood from these results, close adhesion is improved by applying high frequency to the substrate and processing the organic substrate. In addition, the close adhesion is further improved in case high-frequency discharge is prevented. In such an experiment that polyimide resin was applied to a silicon substrate and copper Cu was deposited on polyimide by evaporation as well, it was found that the close adhesion with respect to Cu was strengthened when surface processing was performed by using nitride gas while applying high frequency to the substrate and when discharge due to the high frequency applied to the substrate was not caused. In film forming on the organic substrate or surface refining of the organic material as well, processing while applying high frequency and processing while preventing discharge caused by the high frequency bring about significant effects.

EXAMPLE 13

FIG. 25 is a sectional view of a principal part of a microwave plasma processing apparatus which is one form of the present invention. FIG. 25 is different from FIG. 15 in that an annular target 28 for sputtered material is disposed on the diffusion preventing barrel 26' in the processing chamber. If a high-frequency electric field is applied from high-frequency power supply 29 to the target 28, this target 28 is sputtered and film deposition is obtained on the substrate.

By using a silicon wafer comprising a thermal oxide film so formed as to have thickness of 20 nm as the substrate to be processed and by using a sintered body of barium titanate $Bi_4Ti_3O_{12}$ as the target, a barium titanate film was formed. At this time, the substrate was heated to 300° C. In forming the film, oxygen was introduced from the gas nozzle 11 at a rate of 100 ml/min, and the pressure was defined as 0.3 Pa. The microwave lead-in power was defined as 600 W and the ECR position was so disposed as to be closer to the microwave lead-in position by approximately 20 mm than the target position. A high frequency of 300 kHz and 400 W was applied to the target. Under the above described condition, film formation was conducted in case the high frequency was not applied to the substrate (G), in case the insulating barrel 27' was removed and a high frequency of 400 kHz and 200 W was applied to the substrate ($A_4$), and in case the insulating barrel 27' was disposed and the high frequency was applied ($B_4$). In case of $A_4$, discharge caused by the high frequency applied to the substrate was recognized and DC potential of 300 V was induced in the substrate. In case of $B_4$, the high-frequency discharge was not recognized. In case of G, the formed film was amorphous. In case of $A_4$ and in case of $B_4$, (001) orientation was exhibited. In case of $A_4$, complete monocrystalline property was not exhibited. In case of $B_4$, however, complete monocrystalline property was exhibited. Its lattice constant of C axis was 32.9 nm and a complete ferroelectric film was obtained. When a ferroelectric film is formed, it is thus effective to apply a high frequency to the substrate. A further significant effect is obtained by preventing high-frequency discharge in that system. When a frequency 13.6 MHz which could not be followed by ions was introduced to the 15 substrate at the same power under the condition of $A_4$, only an amorphous film could be obtained. It is thus understood that application of a frequency which can be followed by ion brings about an effect in forming a ferroelectric film.

EXAMPLE 14

By using a sintered body of BiPbSrCaCu as the target and using MgO as the substrate, a superconducting film was formed in the apparatus of FIG. 25. Other conditions were the same as those of the example 13. In case of G, an amorphous film was obtained. In case of $A_4$, a single-phase film was not obtained. In case of $B_4$, a single phase of high critical temperature phase having a lattice constant of C axis equivalent to 37.4 ($A_4$) was obtained. When 13.6 MHz was applied to the substrate, an amorphous film was obtained. As understood from this, application of a frequency which can be followed by ions to the substrate is effective in forming a superconducting film as well. If discharge due to the high frequency applied to the substrate is prevented in the system, a superconducting film having high Tc can be formed.

EXAMPLE 15

Figure 26:
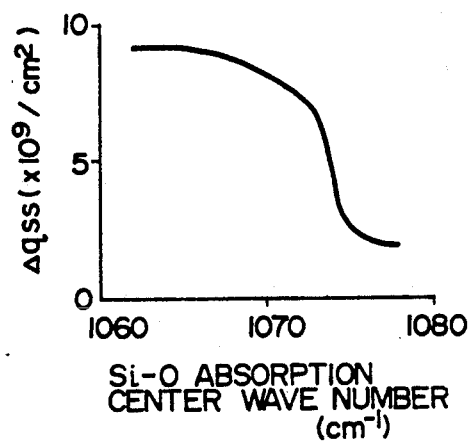
FIG. 26 is a characteristic curve diagram showing dependence of $\Delta qss$ upon the infrared absorption center wave number of Si-O bond.

By using methods described with reference to the example 7 in the apparatus of FIG. 15, $\Delta q_{ss}$ of $SiO_2$ film formed under various conditions was examined. FIG. 26 shows the relation between $\Delta q_{ss}$ and the infrared absorption center wave number of the Si-O bond. Evidently, $\Delta q_{ss}$ depends upon the infrared absorption center wave number of the Si-O bond. It is understood that the amount of electric charge stored in the film decreases as the Si-O bond becomes strong, i.e., as the film quality approaches that formed by an equilibrium chemical reaction. It is also found that the amount of stored electric charge significantly decreases for the Si-O bond not less than 1075 $cm^{-1}$. A MOS transistor formed by using $SiO_2$ having an infrared absorption center wave number not less than 1075 $cm^{-1}$ exhibited nearly the same characteristics as those of a MOS transistor fabricated by using a thermal oxide film.

EXAMPLE 16

Figure 27:
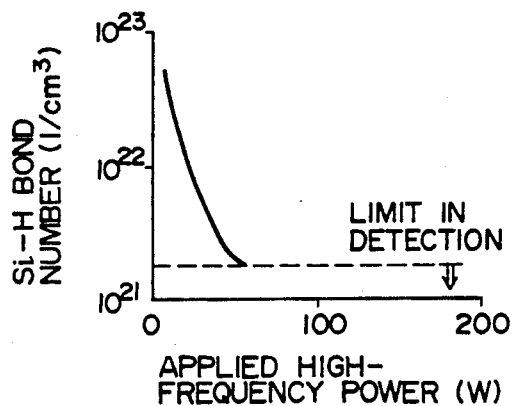
FIGS. 27 and 28 are characteristic curve diagrams showing dependence of Si-H bond number of SiN film and infrared absorption center wave number of Si-N bond upon high-frequency power applied to the substrate, respectively.
Figure 28:
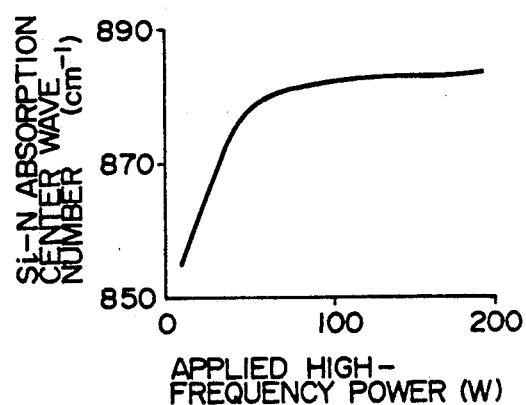

By using the apparatus of the example 6, introducing nitrogen from the gas lead-in nozzle 11 at a rate of 500 ml/min, introducing $SiH_4$ from the gas nozzle 12 at rate of 30 ml/min, and decompressing the inside of the processing chamber to 0.3 Pa, a SiN film was formed on a glass substrate having a Cr film formed thereon. The introduced microwave power was defined as 600 W and the distance between the substrate and the ECR face was defined as 100 mm. FIGS. 27 and 28 show dependence of Si-H bond number of the deposited SiN film and infrared absorption center wave number of Si-N bond upon power of applied high frequency of 400 kHz, respectively. The Si-H bond number was derived from the integral intensity of the Si-H absorption band. The detection limit at this time was not larger than $3 \times 10^{21}$ $cm^{-3}$. When the applied power exceeds nearly 50 W, the Si-H bond disappears and the Si-N bond exceeds 880 $cm^{-1}$. That is to say, it is understood that a film nearly close to the equilibrium chemical reaction can be formed by forming a SiN film while applying a high frequency to it.

EXAMPLE 17

Figure 29:
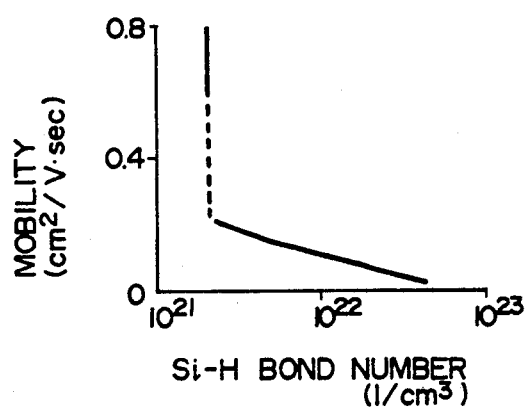
FIGS. 29 and 30 are characteristic curve diagrams showing dependence of the mobility of a thin film transistor fabricated by using a present invention apparatus upon Si-H bond number and dependence of its threshold voltage upon infrared absorption center wave number of Si-N bond, respectively.
Figure 30:
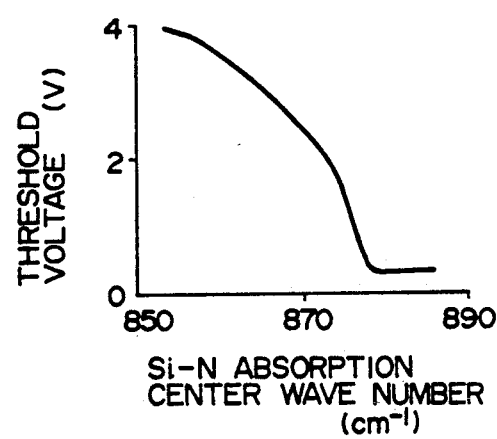

A thin film transistor (TFT) was formed with a gate of a SiN film in a thickness of 300 nm by using the apparatus of FIG. 15 in a way as described with reference to the example 16 but changing the reaction pressure and the microwave power. Its characteristics were examined. A substrate comprising a Cr film formed on a 10-cm square glass plate was used. FIGS. 29 and 30 show dependence of the mobility of the fabricated TFT upon the Si-H bond number and dependence of the threshold upon Si-N absorption center wave number, respectively. It is understood that the mobility is significantly improved when a SiN film having Si-H bond not higher than the detection limit is used. That is to say, if the presence of atoms such as Si-H having high electronegativity on the interface is prevented, electrons are not trapped, resulting in improved electron mobility. When the absorption center wave number exceeds 880 cm-1, the threshold voltage can be significantly lowered. That is to say, if the film quality is brought close to the quality of the film formed by equilibrium chemical reaction, the level of the film can be lowered. As described with reference to the examples 7 and 15, a film having a film quality very close to that of a film formed by equilibrium chemical reaction can be formed by forming a film while applying a frequency which can be followed by ions even when a film is to be formed by using plasma. If the film formed by using the above described method is used for fabrication of semiconductor devices, characteristics reliability can be improved.

Owing to the present invention, occurrence of discharge caused by the high frequency applied to the substrate is significantly suppressed. Without damaging the substrate and degrading element characteristics, the substrate can be processed. As a result, processing with excellent characteristics and high reproducibility can be performed in fabrication of semiconductor devices such as LSI and TFT and fabrication of a disk using an organic substrate. Further, since discharge is suppressed, high-frequency potential applied to the substrate can be used effectively. As a result, processing efficiency can be significantly improved and processing characteristics can be improved. Further, since the amount of highly excited ions impinged on a substrate can be increased, the quality of oxide films and nitride films including ferroelectric materials and superconducting films can be improved.

We claim:

1. A plasma processing apparatus comprising:
   a container made at least in part of a conductive material for housing a substance to be processed;
   means for generating plasma of a selected component by electron cyclotron resonance in said container;
   means for applying a first alternating current electric field to at least a part of a region of said plasma contained in said container; and
   means for covering substantially all of the inner surface areas of said container exposed to said plasma, except for a portion thereof on which the substrate to be processed is located, by a material exhibiting an insulating property at least against said first alternating current electric field.

2. A plasma processing apparatus according to claim 1, wherein said plasma generating means generates plasma using said electron cyclotron resonance caused by application of microwave energy to a plasma generating gas.

3. A plasma processing apparatus according to claim 1, wherein a potential induced in said substance is not higher than 15 V in absolute value.

4. A plasma processing apparatus comprising:
   a plasma processing chamber made at least in part of a conductive material and having a holder for supporting a substance to be processed therein;
   means for guiding microwave energy into said plasma processing chamber;
   means for guiding a plasma generating gas into said plasma processing chamber;
   means disposed outside of said plasma processing chamber for generating a magnetic field, which is introduced into said plasma processing chamber to generate a plasma from said plasma generating bas by electron cyclotron resonance in cooperation with said microwave energy;
   a high-frequency power supply for supplying a high-frequency electric field to said holder; and
   means for insulating substantially all of the inner surface areas of said plasma processing chamber and said holder, which would otherwise be in contact with said plasma, from said plasma.

5. A plasma processing apparatus according to claim 4, wherein said high-frequency power supply supplies a frequency, which is not lower than 10 Hz and not higher than 1 MHz, and has a reference potential equivalent to ground potential.

6. A plasma processing apparatus according to claim 4, wherein said high-frequency power supply supplies a frequency, which is not lower than 10 Hz and not higher than 1 MHz, and has a reference potential floated from ground potential.

7. A plasma processing apparatus according to claim 4, wherein said high-frequency power supply supplies a frequency, which is not lower than 10 Hz and not higher than 1 MHz, and has a reference potential equivalent to the potential of the plasma.

8. A plasma processing apparatus according to claim 4, wherein a potential induced in said substance is not higher than 15 V in absolute value.

9. A plasma processing apparatus comprising:
   a plasma processing chamber made at least in part of a conductive material and having a holder for supporting a substance to be processed therein;
   means for guiding microwave energy into said plasma processing chamber;
   means for guiding a plasma generating gas into said plasma processing chamber;
   means for guiding reaction gas into said plasma processing chamber, said reaction gas reacting with said plasma generating gas;
   means disposed outside of said plasma processing chamber for generating a magnetic field, which is introduced into said plasma processing chamber to generate a plasma from said plasma generating gas by electron cyclotron resonance in cooperation with said microwave energy;
   a high-frequency power supply for supplying a high-frequency electric field to said holder; and
   means for insulating substantially all of the inner surface areas of said plasma processing chamber and said holder, which would otherwise be in contact with said plasma, from said plasma.

10. A plasma processing apparatus according to claim 9, wherein said high-frequency power supply supplies a frequency, which is not lower than 10 Hz and not higher than 1 MHz, and has a reference potential equivalent to ground potential.

11. A plasma processing apparatus according to claim 9, wherein said high-frequency power supply supplies a frequency, which is not lower than 10 Hz and not higher than 1 MHz, and has a reference potential floated from ground potential.

12. A plasma processing apparatus according to claim 9, wherein said high-frequency power supply supplies a frequency, which is not lower than 10 Hz and not higher than 1 MHz, and has a reference potential equivalent to the potential of the plasma.

13. A plasma processing apparatus according to claim 9, wherein a potential induced in said substance is not higher than 15 V in absolute value.

14. A plasma processing method comprising the steps of:
   (1) placing a substance to be processed into a plasma processing chamber made at least in part of a conductive material;
   (2) guiding plasma generating gas into said plasma processing chamber to generate a plasma by electron cyclotron resonance; and
   (3) bringing said plasma into contact with said substance to be processed while insulating substantially all of the inner surfaces of said chamber from the plasma so as to avoid discharge between said substance to be processed and said plasma.

15. A plasma processing method according to claim 14, wherein a potential induced in said substance is not larger than 15 V in absolute value.

16. A plasma processing method comprising the steps of:
   (1) placing a substance to be processed into a plasma processing chamber made at least in part of a conductive material;
   (2) guiding plasma generating gas into said plasma processing chamber and applying microwave energy and a magnetic field to said plasma generating gas to generate a plasma by electron cyclotron resonance; and (3) bringing said plasma into contact with said substance to be processed, while applying a high-frequency electric field to said substance, and insulating substantially all of the inner surfaces of said chamber from the plasma so as to avoid discharge between said substance to be processed and said plasma.

17. A plasma processing method according to claim 16, wherein a potential induced in said substance is not larger than 15 V in absolute value.

18. A plasma processing method comprising the steps of:

(1) placing a substance to be processed into a plasma processing chamber made at least in part of a conductive material;

(2) guiding plasma generating gas into said plasma processing chamber and applying microwave energy and a magnetic field to said plasma generating gas to generate a plasma by electron cyclotron resonance;

(3) guiding reaction gas for reacting with said plasma generating gas into said plasma processing chamber; and (4) bringing said plasma into contact with said substance to be processed, while applying a high-frequency electric field to said substance, and insulating substantially all of the inner surfaces of said chamber from the plasma so as to avoid discharge between said substance to be processed and said plasma.

19. A plasma processing method according to claim 18, wherein a potential induced in said substance is not larger than 15 V in absolute value.

20. A plasma processing apparatus comprising:

a plasma processing chamber made at least in part of a conductive material and having a holder for supporting a substance to be processed therein;

means for guiding microwave energy into said plasma processing chamber and generating a plasma by electron cyclotron resonance;

a high-frequency power supply for supplying a high-frequency electric field to said holder; and means for insulating substantially all of the inner surface areas of said plasma processing chamber and said holder, which would otherwise be in contact with said plasma, from said plasma.

21. A plasma processing apparatus according to claim 20, wherein said high-frequency power supply supplies a frequency, which is not lower than 10 Hz and not higher than 1 MHz, and has a reference potential equivalent to the ground potential.

22. A plasma processing apparatus according to claim 20, wherein said high-frequency power supply supplies a frequency, which is not lower than 10 Hz and not higher than 1 MHz, and has a reference potential floated from the ground potential.

23. A plasma processing apparatus according to claim 20, wherein said high-frequency power supply supplies a frequency, which is not lower than 10 Hz and not higher than 1 MHz, and has a reference potential equivalent to the potential of the plasma.

24. A plasma processing apparatus according to claim 20 wherein a potential induced in said substance is not higher than 15 V in absolute value.

* * * * *